United States Patent
Matsushita et al.

(10) Patent No.: US 7,238,997 B2
(45) Date of Patent: Jul. 3, 2007

(54) SEMICONDUCTOR DEVICE AND METHOD OF MANUFACTURING THE SAME

(75) Inventors: Daisuke Matsushita, Hiratsuka (JP); Koichi Muraoka, Sagamihara (JP); Yasushi Nakasaki, Yokohama (JP); Koichi Kato, Yokohama (JP); Takashi Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/197,593

(22) Filed: Aug. 5, 2005

(65) Prior Publication Data

US 2006/0175672 A1 Aug. 10, 2006

(30) Foreign Application Priority Data

Feb. 7, 2005 (JP) ............... 2005-030586

(51) Int. Cl.
*H01L 29/94* (2006.01)
(52) U.S. Cl. ............... 257/411; 257/410; 257/E29.132; 257/E29.165; 438/216; 438/261; 438/287; 438/591
(58) Field of Classification Search ........ 257/E29.132, 257/E29.133, E29.165, 410, 411; 438/216, 438/261, 287, 591
See application file for complete search history.

(56) References Cited

U.S. PATENT DOCUMENTS 4,903,102 A * 2/1990 Yamazaki ............... 257/77

6,974,996 B2 * 12/2005 Shiga et al. ............... 257/330
2003/0168706 A1 9/2003 Aoki et al.
2005/0064667 A1 3/2005 Matsushita et al.
2005/0106894 A1 5/2005 Aoki et al.
2005/0258491 A1 * 11/2005 Bojarczuk et al. .......... 257/369

FOREIGN PATENT DOCUMENTS

JP 59-207811 11/1984

OTHER PUBLICATIONS

Matsushita, D. et al., "Atomic-Scale Characterization of Nitridation Processes on Si(100)-2+1 Surfaces by Radical Nitrogen," Jpn. J. Appl. Phys. vol. 40, Pt. 1, No. 4B, pp. 2827-2829, (Apr. 2001).
D. Matsushita et al., "Novel Fabrication Process to Realize Ultra-thin (EOT 0.7nm) and Ultra-low Leakage SiON Gate Dielectrics," Symposium on VLSI Technology (2004), pp. 172-173.
H. Yang et al., "Nanostructures of the turbostratic BN transition layer in cubic BN thin films deposited by low-pressure inductively coupled plasma-enhanced chemical vapor deposition," Journal of Applied Physics (May 15, 2002), 91:6695-99.
Z. Wang et al., "Effect of Polysilicon Gate Type on the Flatband Voltage Shift for Ultrathin Oxide-Nitride Gate Stacks," IEEE Electron Device Letters (Apr. 2000), 21:170-172.

* cited by examiner

*Primary Examiner*—Minhloan Tran
*Assistant Examiner*—Benjamin Tzu-Hung Liu
(74) *Attorney, Agent, or Firm*—Finnegan, Henderson, Farabow, Garrett & Dunner, L.L.P.

(57) ABSTRACT

According to an aspect of the present invention, there is disclosed a semiconductor device comprising a semiconductor substrate, and a gate insulating film of a P-channel MOS transistor, formed on the semiconductor substrate. The gate insulating film has an oxide film ($SiO_2$), and a diffusion preventive film (BN) containing boron and nitrogen atoms.

26 Claims, 12 Drawing Sheets

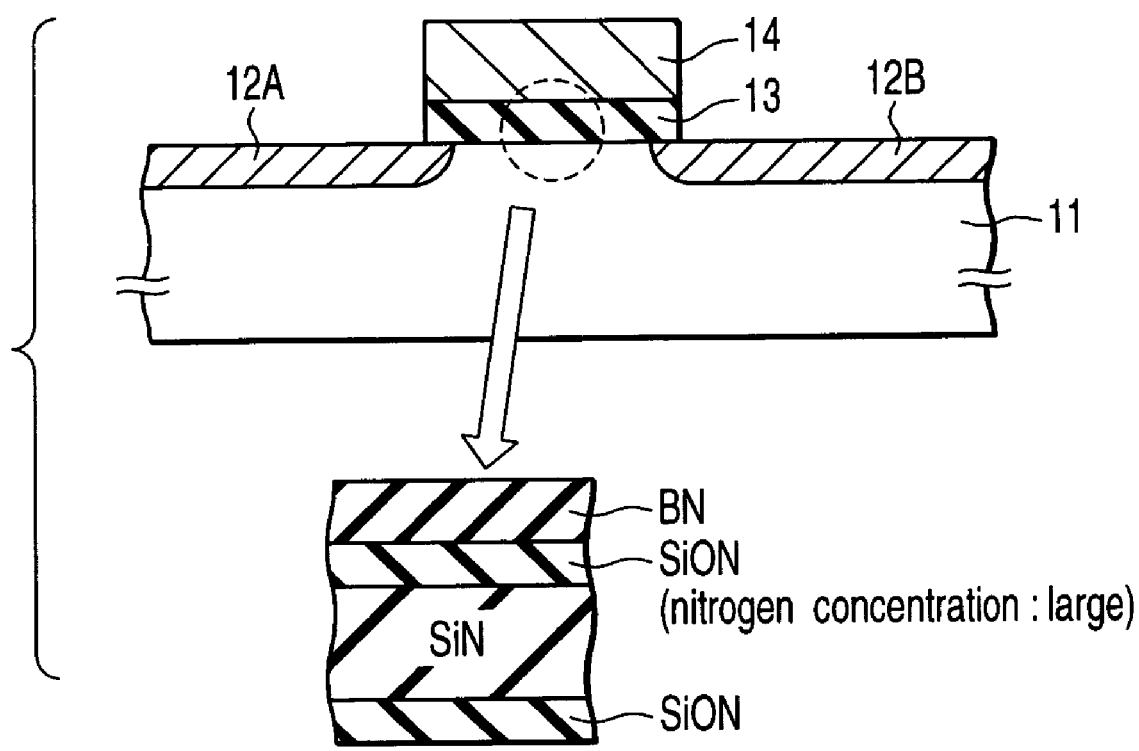
F I G. 1 4

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2005-030586, filed Feb. 7, 2005, the entire contents of which are incorporated herein by reference.

BACKGROUND OF THE INVENTION

1. Field of the Invention

The present invention relates to a semiconductor device and a method of manufacturing the device.

2. Description of the Related Art

A demand for high performance of LSI is increasing with sophistication of information in the society. Enhancement of the performance is achieved mainly by miniaturization of MOS transistors.

In the existing LSI, a gate insulating film of the MOS transistor has a thickness of about 1.5 nm. When the miniaturization simply progresses because of further enhancement of the performance, it is expected in International Technology Roadmap for Semiconductor (ITRS) that the thickness of the gate insulating film of the MOS transistor is about 0.7 nm around 2010.

However, when the gate insulating film becomes thin in this manner, a tunnel current flows through the gate insulating film at an operation time of the MOS transistor. This is called gate leak, and this is not preferable for the enhancement of the performance of the LSI.

To solve the problem, a technique has been researched which prevents the gate leak from being generated, even when the gate insulating film is thinned.

For example, a technique has been noted to use, as the gate insulating film, a material (high-k material) such as nitrogen-containing silicon oxide having a permittivity larger than that of silicon oxide which has heretofore been used well as the material of the gate insulating film.

For example, SiON containing a high concentration of nitrogen is one of candidates of the material (see, e.g., D. Matsushita et al., Symp. VLSI Tech., (2004) 172). This material has characteristics that the nitrogen concentration inside the gate insulating film is sufficiently high, although silicon oxide is used in an interface between the gate insulating film and a silicon substrate. Accordingly, there can be provided a gate insulating film having a high permittivity and satisfactory interface characteristic.

However, there is a problem caused by the high concentration of nitrogen in silicon oxide.

This is abnormal shift of flat band of a P-channel MOS transistor (see, e.g., Z. Wang et al., IEEE Electron Device Lett., 21 (2000) 170). That is, from a viewpoint of circuit design, when the flat band of the P-channel MOS transistor shifts, an impermissibly large problem is caused in the circuit characteristic. To solve the problem, it is necessary to give up the raising of the concentration of nitrogen in silicon oxide.

BRIEF SUMMARY OF THE INVENTION

According to an aspect of the present invention, there is provided a semiconductor device comprising a semiconductor substrate; and an insulating film formed on the semiconductor substrate, the insulating film has a region containing oxygen atoms and a region containing boron and nitrogen atoms.

According to an aspect of the present invention, there is provided a semiconductor device comprising a semiconductor substrate; and an insulating film formed on the semiconductor substrate, the insulating film has a region containing nitrogen atoms and a region containing boron and nitrogen atoms.

According to an aspect of the present invention, there is provided a method of manufacturing a semiconductor device, comprising a step of forming a region containing oxygen atoms on a semiconductor substrate; and a step of forming a region containing boron and nitrogen atoms on the region containing the oxygen atoms.

According to an aspect of the present invention, there is provided a method of manufacturing a semiconductor device, comprising a step of forming a region containing nitrogen atoms on a semiconductor substrate; and a step of forming a region containing boron and nitrogen atoms on the region containing the nitrogen atoms.

BRIEF DESCRIPTION OF THE SEVERAL VIEWS OF THE DRAWING

FIG. 14 is a sectional view showing a structure of an MOS transistor according to a fourth embodiment;

DETAILED DESCRIPTION OF THE INVENTION

Figure 1:
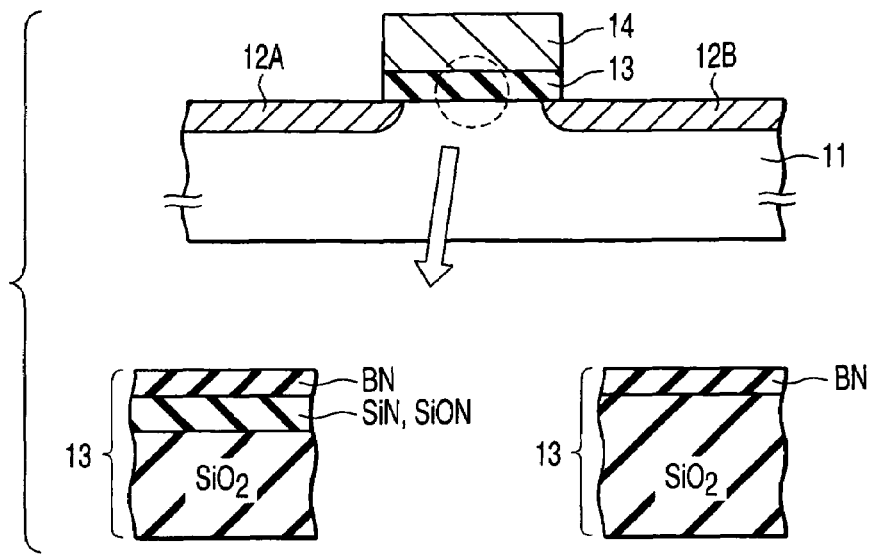
FIG. 1 is a sectional view showing a structure of an MOS transistor according to a first embodiment.

A semiconductor device of an aspect of the present invention will be described below in detail with reference to the accompanying drawing.

1. Outline

In an aspect of the present invention, there is proposed an insulating film capable of preventing penetrating or diffusing of impurities, and having a high permittivity, small EOT, superior moisture resistance, and small shift amount of a threshold voltage. For example, in the aspect of the present invention, there is proposed a structure of a gate insulating film of a P-channel MOS transistor in which problems such as gate leak and flat band shift are not caused even when a film is thinned.

First, a cause for the flat band shift will be studied.

The flat band shift occurs in the P-channel MOS transistor. Here, in the P-channel MOS transistor, a polysilicon mainly containing boron is used as a gate electrode. Boron diffuses to a gate insulating film from the gate electrode, bonds to nitrogen in the gate insulating film, and generates dangling bond of silicon. This is a large cause for the flat band shift.

That is, highly concentrated nitrogen has heretofore been contained in the gate insulating film for a purpose of reduction of a threshold-value fluctuation of the MOS transistor by the "penetrating of boron". Additionally, in subsequent generations, it is necessary to inhibit generation of the dangling bond of silicon by the "diffusing of boron".

In the example of the present invention, in order to mainly prevent the dangling bond of silicon, a diffusion preventive film containing boron and nitrogen atoms is formed on the surface of the gate insulating film (silicon oxide, silicon nitride, SiON, etc.). For example, boron nitride (BN) is used as the diffusion preventive film.

Since the diffusion preventive film containing the boron and nitrogen atoms has a high atomic density ($Si_3N_4$: 100 atoms/nm$^3$, BN: 130 atoms/nm$^3$) as compared with $Si_3N_4$ generally used as the diffusion preventive film of boron, boron can further be inhibited from being diffused. As a result, it is possible to further enhance the nitrogen concentration in the insulating film. Therefore, an equipment oxide thickness (EOT) is substantially reduced without any gate leak or flat band shift, and performance of LSI can be enhanced.

It is to be noted that to contain boron in the diffusion preventive film, for example, the diffusion preventive film is used by methods such as a magnetron sputtering process, a PLD process, a chemical vapor development (CVD) process, and an ICP-CVD process using a gas containing boron atoms such as $BC_{=3}$—$NH_3$—$H_2$—$SiC_{=4}$, $B_2H_6$.

Accordingly, invasion of boron in the gate electrode into the gate insulating film can be prevented, and the dangling bond of silicon by bonding of boron and nitrogen can be eliminated. Therefore, for example, the flat band shift accompanying the high concentration of nitrogen in the gate insulating film can be suppressed.

As a result, there can be provided the gate insulating film of the P-channel MOS transistor having a high nitrogen concentration (small EOT).

2. Embodiments

Next, several embodiments supposed to be best will be described.

(1) First Embodiment

A semiconductor device and a method of manufacturing the device according to a first embodiment will be described.

A. Structure

FIG. 1 shows a structure of a P-channel MOS transistor according to a first embodiment.

P-type diffusion layers 12A, 12B are formed in a surface region of an N-type silicon substrate (may be a well) 11. A gate electrode 14 is formed on a channel region between the P-type diffusion layers 12A, 12B via a gate insulating film 13. The gate electrode 14 comprises a polysilicon containing P-type impurities (e.g., boron).

Here, as shown in Example 1, the gate insulating film 13 comprises: silicon oxide ($SiO_2$); a nitrogen-containing portion formed on silicon oxide; and a diffusion preventive film formed on the nitrogen-containing portion and containing boron and nitrogen atoms.

The nitrogen-containing portion may be, for example, SiN formed on silicon oxide, or SiON formed by introducing nitrogen into a surface portion of silicon oxide. The diffusion preventive film comprises, for example, BN.

Moreover, as shown in Example 2, the gate insulating film 13 may comprise: silicon oxide ($SiO_2$); and a diffusion preventive film (e.g., BN) formed on silicon oxide and containing boron and nitrogen atoms.

In Examples 1 and 2, since the diffusion preventive film has a function of simultaneously preventing both penetration and diffusion of boron in the gate electrode 14, a flat band shift in the P-channel MOS transistor can be effectively prevented even when the gate insulating film becomes thin.

B. Manufacturing Method

Figure 2:
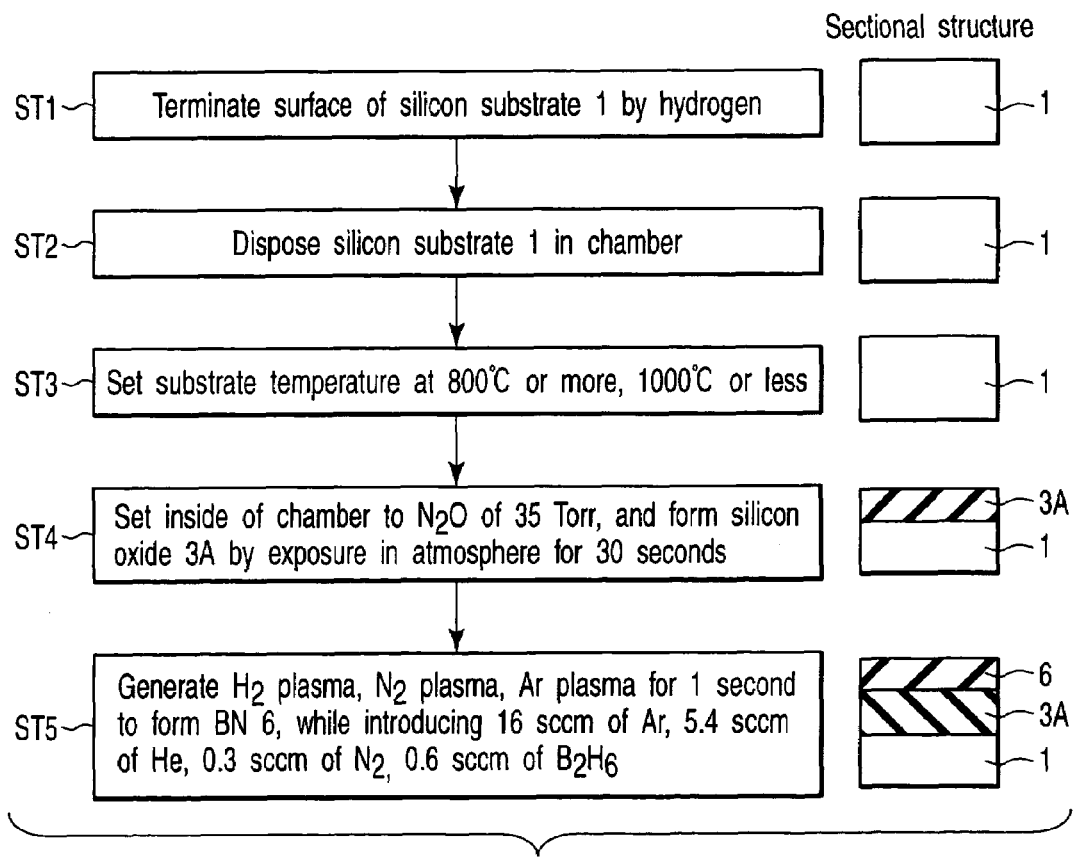
FIG. 2 is a diagram showing a method of manufacturing a gate insulating film of an MOS transistor of FIG. 1.

Next, a method of manufacturing a gate insulating film in the MOS transistor of FIG. 1 will be described with reference to FIG. 2.

First, a silicon substrate 1 is treated with dilute HF, and the surface of the silicon substrate 1 is terminated by hydrogen (step ST1). Thereafter, the silicon substrate 1 is introduced into a chamber (step ST2). Subsequently, an atmosphere in the chamber is set to, for example, $N_2O$ of 35 Torr, a heater is controlled to thereby set temperature of the surface of the silicon substrate 1 at 800° C. or more, 1000° C. or less (e.g., 800° C.), and this state is maintained for about 30 seconds. As a result, silicon oxide ($SiO_2$) 3A is formed on the silicon substrate 1 (steps ST3 and ST4).

Subsequently, 16 sccm of Ar, 5.4 sccm of He, 0.3 sccm of $N_2$, 0.6 sccm of $B_2H_6$ are introduced to generate $H_2$, $N_2$, Ar plasmas for about one second. Here, a flow rate of $B_2H_6$ is set to about 10% of that of He. Accordingly, the surface of silicon oxide 3A is etched by the $N_2$ and $H_2$ plasmas, and BN 6 is formed into a thickness of about 0.3 nm on silicon oxide 3A (step ST5).

The structure of Example 2 is completed by the above-described steps.

It is to be noted that when a step of forming SiN or SiON is added between the steps ST4 and ST5, the structure of Example 1 can be obtained.

C. Effect

Effects by the semiconductor device and the manufacturing method according to the first embodiment will be described.

Figure 3:
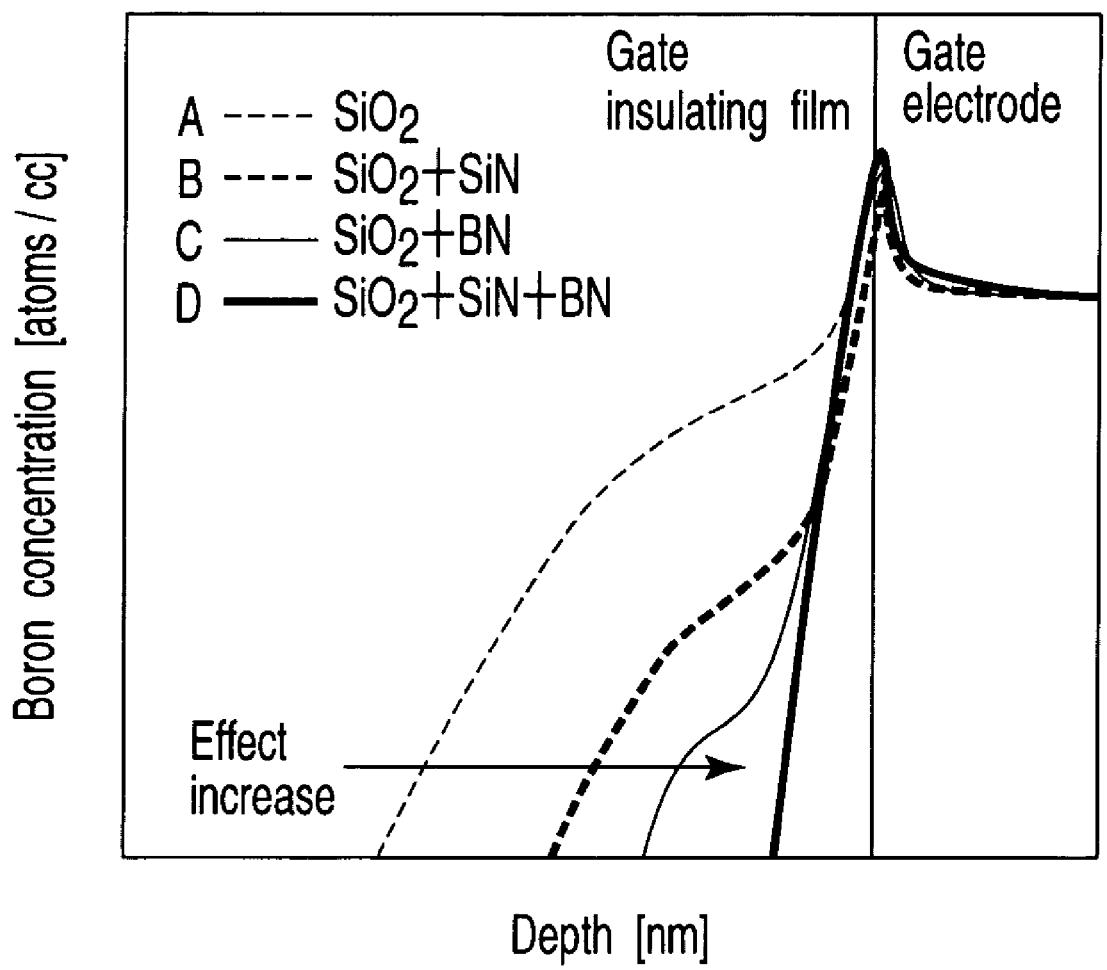
FIG. 3 is a characteristic diagram showing a penetrating/diffusing resistance of boron.

FIG. 3 shows degrees of penetration and diffusion of boron in a gate electrode by comparison in the structure of the gate insulating film.

Here, four types of gate insulating films are shown as examples, and it is assumed that any of them has a physical film thickness (actual thickness of a portion for use as the gate insulating film) of 2 nm.

First is a gate insulating film formed of only silicon oxide ($SiO_2$), second is a gate insulating film formed of silicon oxide and silicon nitride (SiN), third is a gate insulating film comprising BN formed into a thickness of 0.3 nm on silicon oxide, and fourth is a gate insulating film comprising silicon nitride and 0.3 nm of BN formed on silicon oxide.

In the gate insulating film formed of silicon oxide only, not only diffusing of boron but also penetrating of boron occur. In this case, any flat band shift cannot be suppressed. In the gate insulating film formed of silicon oxide and silicon nitride, the penetration and diffusion of boron are suppressed to certain degrees, but this is not complete.

On the other hand, in the gate insulating film comprising BN formed on silicon oxide, the penetration and diffusion of boron are substantially completely suppressed. In the gate insulating film comprising silicon nitride and BN formed on silicon oxide, the penetration and diffusion of boron are completely inhibited, and the flat band shift can be prevented.

When the physical film thickness of the gate insulating film indicates a value of 2 nm or less in this manner, the diffusion preventive film (e.g., BN) containing the boron and nitrogen atoms is formed on the surface of the gate insulating film. This is very effective means for preventing the flat band shift by the penetration and diffusion of boron from the gate electrode into the gate insulating film.

Figure 4:
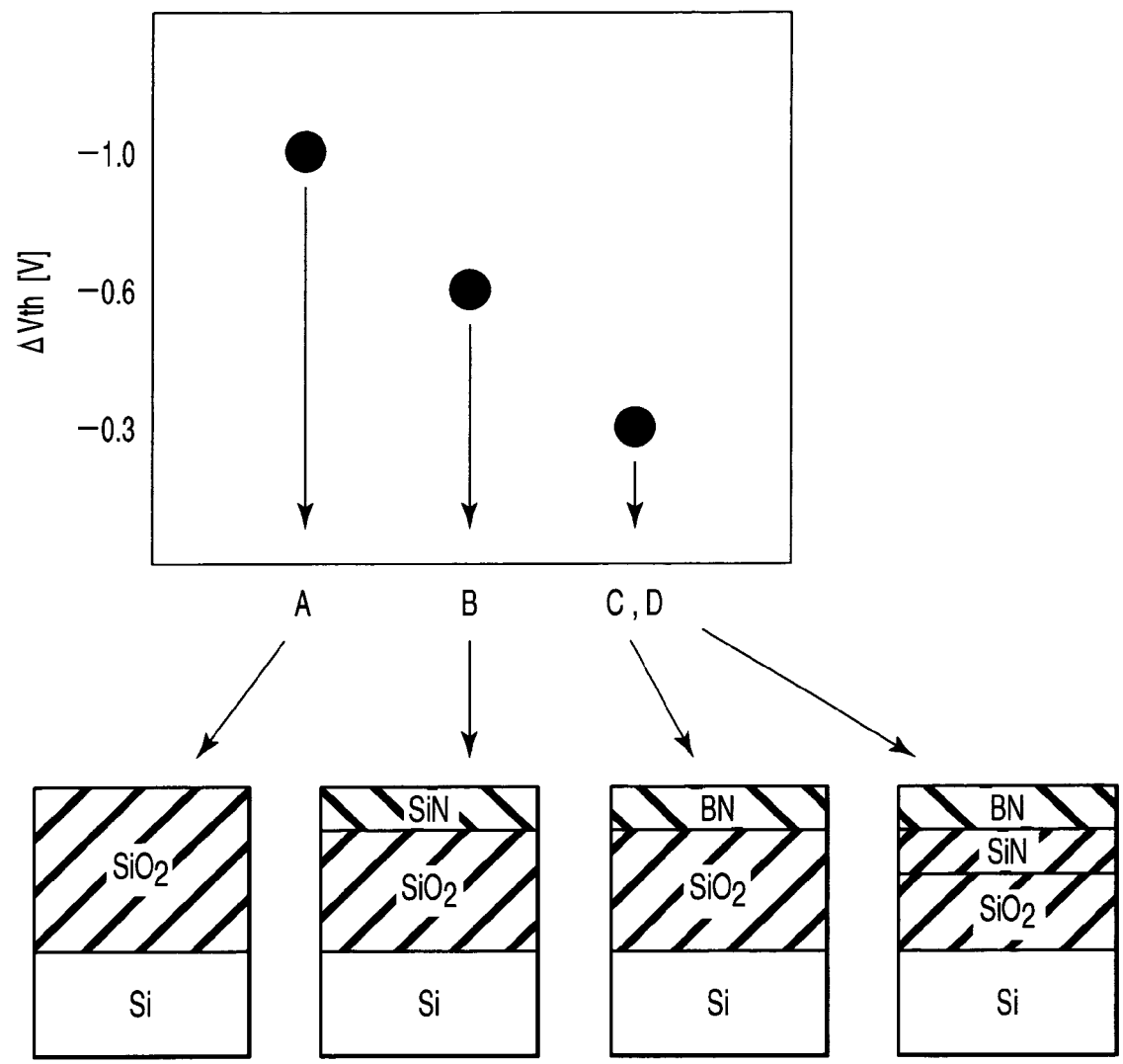
FIG. 4 is a characteristic diagram showing a threshold characteristic of the MOS transistor in accordance with a type of a gate insulating film.

FIG. 4 shows degrees of fluctuations of threshold voltage of a P-channel MOS transistor at a time when four types of gate insulating films compared in FIG. 3 are used.

ΔVth is a shift amount of the threshold voltage of the P-channel MOS transistor by the penetration and diffusion of boron, and corresponds to the fluctuation.

In the gate insulating film having the diffusion preventive film (e.g., BN) containing the boron and nitrogen atoms, it is seen that the shift amount ΔVth of the threshold voltage is small as compared with a gate insulating film which does not have any diffusion preventive film. This is because the penetration and diffusion of boron from the gate electrode into the gate insulating film are suppressed by the diffusion preventive film as described above.

Therefore, according to the first embodiment, even when the physical film thickness of the gate insulating film of the P-channel MOS transistor indicates a value of 2 nm or less, controllability of threshold voltage Vth does not deteriorate, and this can contribute to enhancement of performance of the LSI.

(2) Second Embodiment

Next, a semiconductor device and a method of manufacturing the device will be described according to a second embodiment. The second embodiment is modification of the first embodiment. The second embodiment is different from the first embodiment in that silicon nitride is used as a gate insulating film instead of silicon oxide.

A. Structure

Figure 5:
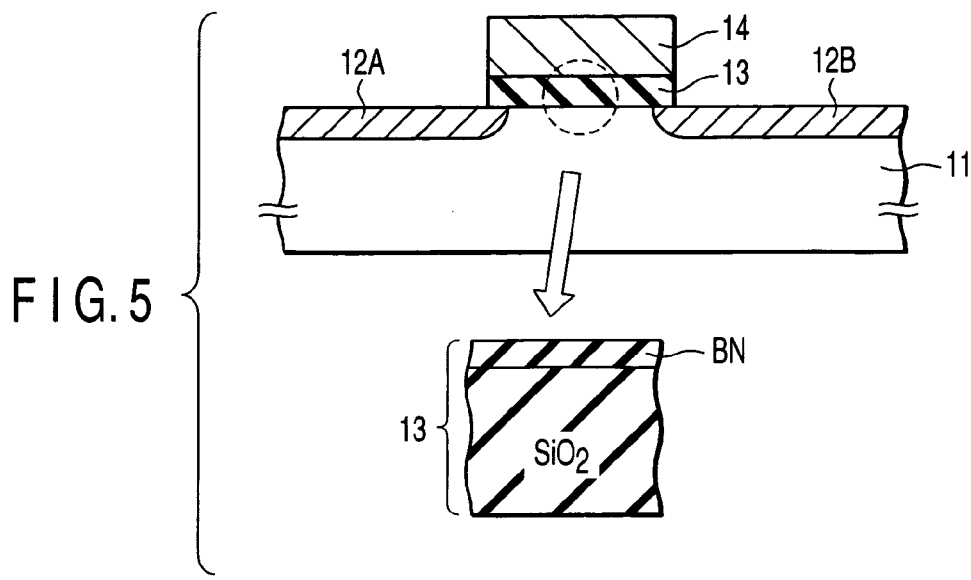
FIG. 5 is a sectional view showing a structure of an MOS transistor according to a second embodiment.

FIG. 5 shows a structure of a P-channel MOS transistor according to a second embodiment.

P-type diffusion layers 12A, 12B are formed in a surface region of an N-type silicon substrate (may be a well) 11. A gate electrode 14 is formed on a channel region between the P-type diffusion layers 12A, 12B via a gate insulating film 13. The gate electrode 14 comprises a polysilicon containing P-type impurities (e.g., boron).

Here, the gate insulating film 13 comprises: silicon nitride (SiN); and a diffusion preventive film formed on silicon nitride and containing boron and nitrogen atoms.

It is to be noted that the gate insulating film 13 which is constituted of silicon nitride may be a nitrogen-containing insulating film, and the gate insulating film 13 may contain, for example, an atom (excluding the boron atom) such as the oxygen atom other than nitrogen and silicon atoms.

Moreover, the diffusion preventive film comprises, for example, BN.

Since the diffusion preventive film has a function of simultaneously preventing both penetration and diffusion of boron in the gate electrode 14, a flat band shift in the P-channel MOS transistor can be effectively prevented even if the gate insulating film becomes thin.

B. Manufacturing Method

Figure 6:
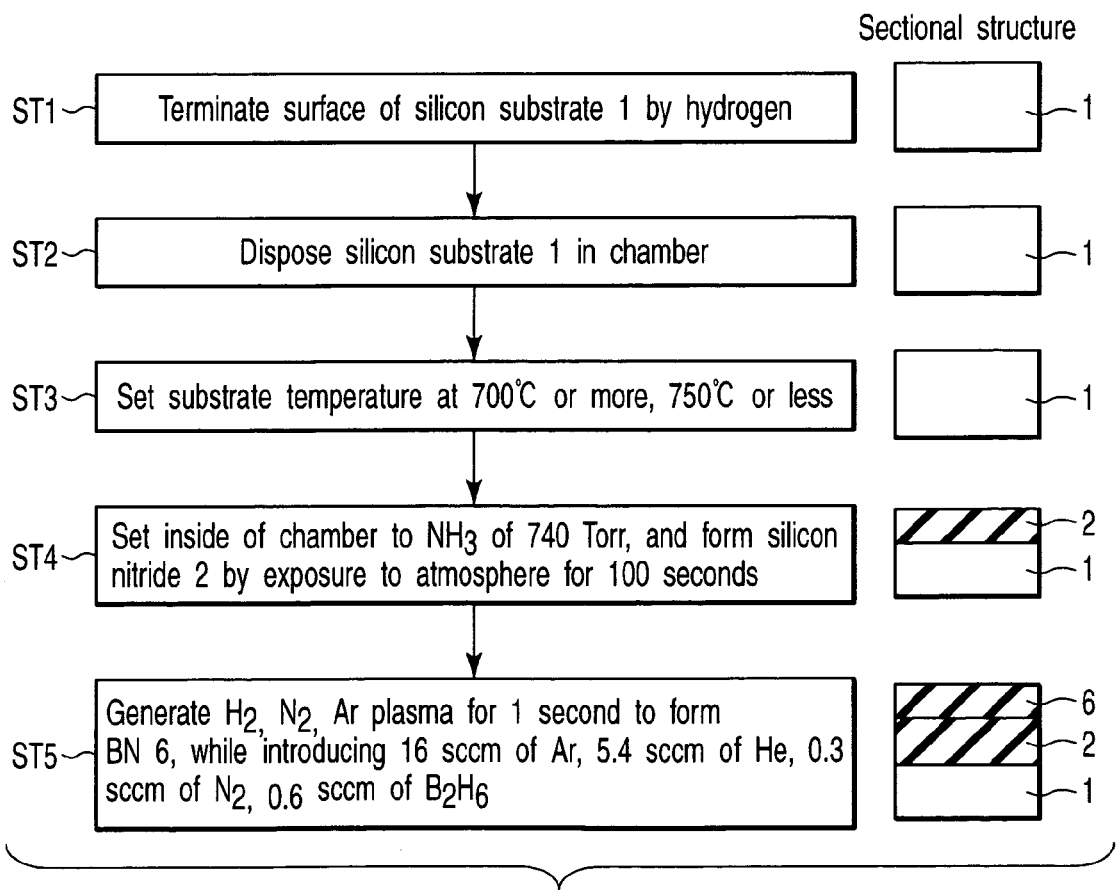
FIG. 6 is a diagram showing a method of manufacturing a gate insulating film of the MOS transistor of FIG. 5.

Next, a method of manufacturing a gate insulating film in the MOS transistor of FIG. 5 will be described with reference to FIG. 6.

First, a silicon substrate 1 is treated with dilute HF, and the surface of the silicon substrate 1 is terminated by hydrogen (step ST1). Thereafter, the silicon substrate 1 is introduced into a chamber (step ST2). Subsequently, an atmosphere in the chamber is set to, for example, $NH_3$ of 740 Torr, a heater is controlled to thereby set temperature of the surface of the silicon substrate 1 at 700° C. or more, 750° C. or less (e.g., 700° C.), and this state is maintained for about 100 seconds. As a result, silicon nitride (SiN) 2 is formed on the silicon substrate 1 (steps ST3 and ST4).

Subsequently, 16 sccm of Ar, 5.4 sccm of He, 0.3 sccm of $N_2$, 0.6 sccm of $B_2H_6$ are introduced to generate $H_2$, $N_2$, Ar plasmas for about one second. Here, a flow rate of $B_2H_6$ is set to about 10% of that of He. Accordingly, the surface of silicon nitride 2 is etched by the $N_2$ and $H_2$ plasmas, and BN 6 is formed into a thickness of about 0.3 nm on silicon nitride 2 (step ST5).

The gate insulating film of the P-channel MOS transistor of FIG. 5 is completed by the above-described steps.

C. Effect

Effects by the semiconductor device and the manufacturing method according to the second embodiment will be described.

Figure 7:
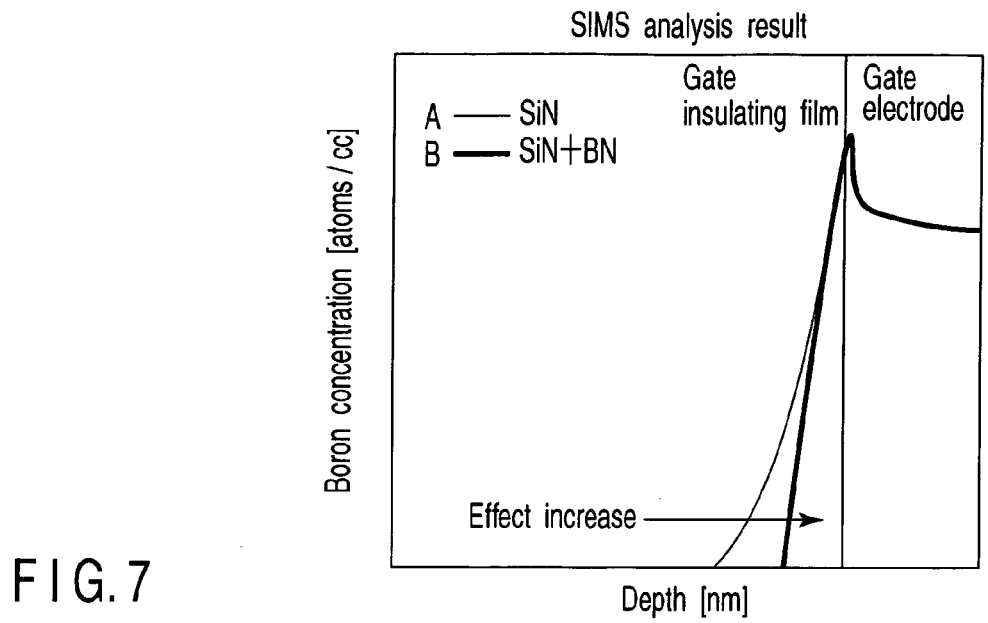
FIG. 7 is a characteristic diagram showing a penetrating/diffusing resistance of boron.

FIG. 7 shows degrees of penetration and diffusion of boron in a gate electrode by comparison in the structure of the gate insulating film.

Here, two types of gate insulating films are shown as examples, and it is assumed that either of them has a physical film thickness of 1.5 nm. First is a gate insulating film formed of only silicon nitride (SiN), and second is a gate insulating film comprising BN formed into a thickness of 0.3 nm on silicon nitride.

In the gate insulating film formed of silicon nitride only, the penetration and diffusion of boron are suppressed to certain degrees, but this is not complete. On the other hand, in the gate insulating film comprising BN formed on silicon nitride, the penetration and diffusion of boron are substantially completely suppressed.

When the physical film thickness of the gate insulating film indicates a value of 2 nm or less, the diffusion preventive film (e.g., BN) containing the boron and nitrogen atoms is formed on the surface of the gate insulating film. This is very effective means for preventing the flat band shift by the penetration and diffusion of boron from the gate electrode into the gate insulating film.

Figure 8:
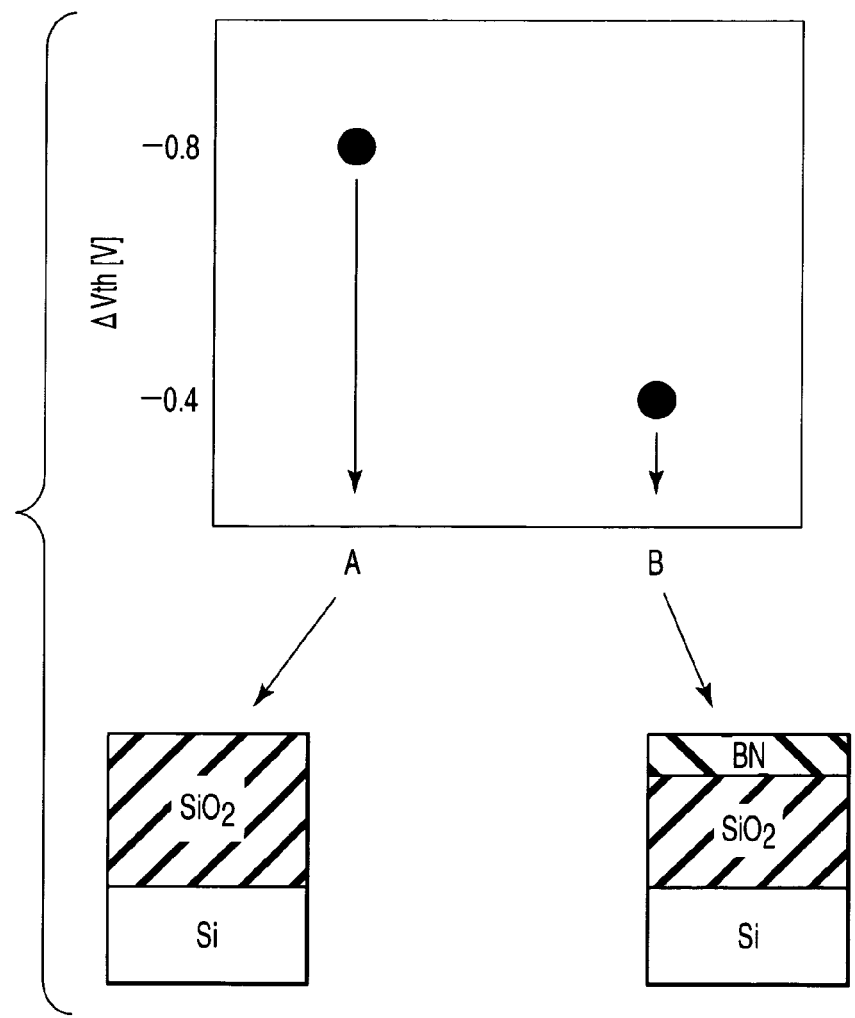
FIG. 8 is a characteristic diagram showing a threshold characteristic of the MOS transistor in accordance with a type of the gate insulating film.

FIG. 8 shows degrees of fluctuations of threshold voltage of a P-channel MOS transistor at a time when two types of gate insulating films compared in FIG. 7 are used.

ΔVth is a shift amount of the threshold voltage of the P-channel MOS transistor by the penetration and diffusion of boron, and corresponds to the fluctuation.

In the gate insulating film having the diffusion preventive film (e.g., BN) containing the boron and nitrogen atoms, it is seen that the shift amount ΔVth of the threshold voltage is small as compared with a gate insulating film which does not have any diffusion preventive film. This is because the penetration and diffusion of boron from the gate electrode into the gate insulating film are suppressed by the diffusion preventive film as described above.

Therefore, even in the second embodiment, when the physical film thickness of the gate insulating film of the P-channel MOS transistor indicates a value of 2 nm or less, controllability of threshold voltage Vth can be prevented from being deteriorated, and this can contribute to enhancement of performance of the LSI.

Figure 9:
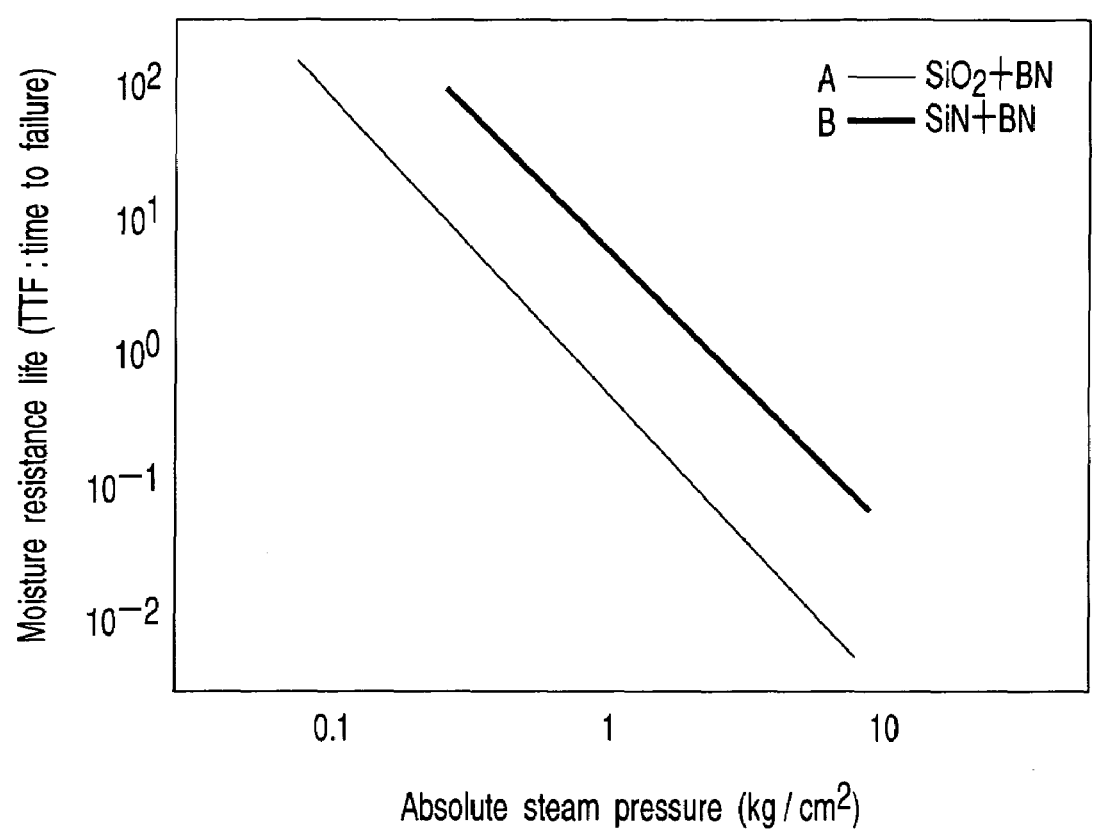
FIG. 9 is a characteristic diagram showing a moisture resistance of an insulating film according to an example of the present invention.

FIG. 9 is a graph showing changes of moisture resistance of a gate insulating film in a case where (first embodiment) the diffusion preventive film is formed on silicon oxide and in a case where (second embodiment) the diffusion preventive film is formed on silicon nitride.

It is seen from the figure that the gate insulating film formed of silicon nitride (e.g., SiN) and the diffusion preventive film (e.g., BN) is superior in moisture resistance to the gate insulating film formed of silicon oxide (e.g., $SiO_2$) and the diffusion preventive film.

This is supposedly because by the use of silicon nitride in the gate insulating film, a part of silicon nitride changes to metal nitride, a bonded state between silicon nitride and the diffusion preventive film is stabilized, and the gate insulating film becomes inactive.

It is to be noted that when BN forming the diffusion preventive film contains metal nitride such as $Si_3N_4$ in a range of 0.05 to 0.15 wt %, characteristics such as peelability and moisture resistance are largely enhanced.

In the second embodiment, since the diffusion preventive film containing the boron and nitrogen atoms is formed on silicon nitride, the penetration and diffusion of boron can be prevented, and the gate insulating film can be strengthened.

(3) Third Embodiment

Next, a semiconductor device and a method of manufacturing the device will be described according to a third embodiment. The third embodiment is modification of the second embodiment. The third embodiment is different from the second embodiment in that silicon nitride whose interface has been oxidized is used as a gate insulating film instead of silicon nitride.

A. Structure

Figure 10:
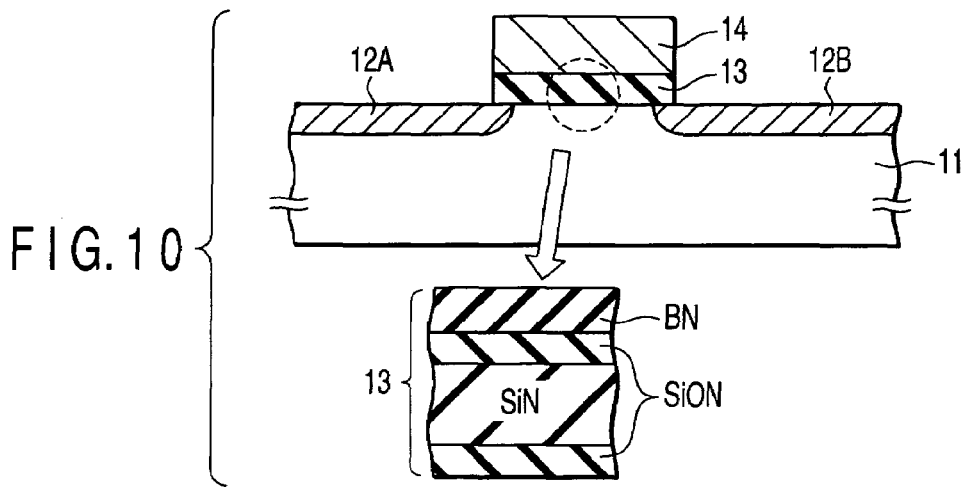
FIG. 10 is a sectional view showing a structure of an MOS transistor according to a third embodiment.

FIG. 10 shows a structure of a P-channel MOS transistor according to a third embodiment.

P-type diffusion layers 12A, 12B are formed in a surface region of an N-type silicon substrate (may be a well) 11. A gate electrode 14 is formed on a channel region between the P-type diffusion layers 12A, 12B via a gate insulating film 13. The gate electrode 14 comprises a polysilicon containing P-type impurities (e.g., boron).

Here, the gate insulating film 13 comprises: silicon nitride (SiON) whose interface has been oxidized; and a diffusion preventive film formed on silicon nitride and containing boron and nitrogen atoms.

It is to be noted that the gate insulating film 13 which is constituted of silicon nitride may be a nitrogen-containing insulating film, and it may contain, for example, an atom (excluding the boron atom) such as the oxygen atom other than nitrogen and silicon atoms.

Moreover, the diffusion preventive film comprises, for example, BN.

Since the diffusion preventive film has a function of simultaneously preventing both penetration and diffusion of boron in the gate electrode 14, a flat band shift in the P-channel MOS transistor can be effectively prevented even if the gate insulating film becomes thin.

B. Manufacturing Method

Figure 11:
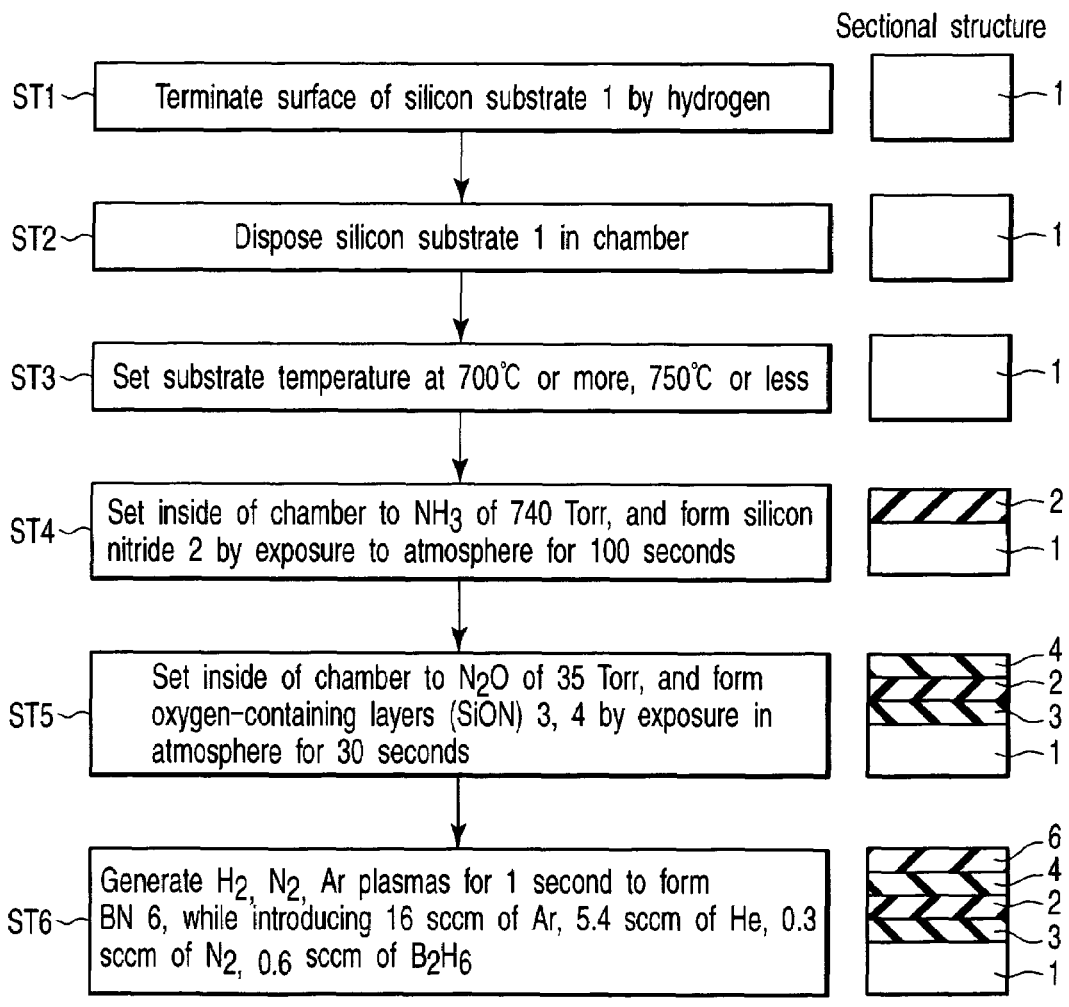
FIG. 11 is a diagram showing a method of manufacturing a gate insulating film of the MOS transistor of FIG. 10.

Next, a method of manufacturing a gate insulating film in the MOS transistor of FIG. 10 will be described with reference to FIG. 11.

First, a silicon substrate 1 is treated with dilute HF, and the surface of the silicon substrate 1 is terminated by hydrogen (step ST1). Thereafter, the silicon substrate 1 is introduced into a chamber (step ST2). Subsequently, an atmosphere in the chamber is set to, for example, $NH_3$ of 740 Torr, a heater is controlled to thereby set temperature of the surface of the silicon substrate 1 at 700° C. or more, 750° C. or less (e.g., 700° C.), and this state is maintained for about 100 seconds. As a result, silicon nitride (SiN) 2 is formed on the silicon substrate 1 (steps ST3 and ST4).

Next, the chamber is filled with, for example, $N_2O$ of 35 Torr, and a heater is controlled to thereby set temperature of the surface of the silicon substrate 1 at 800° C. or more, 1000° C. or less (e.g., 800° C.) and this state is maintained for about 30 seconds. As a result, silicon nitride (e.g., SiON) 3, 4 containing an oxygen atom are formed on an interface of silicon nitride 2, that is, between the silicon substrate 1 and silicon nitride 2, and on the upper surface of silicon nitride 2 (step ST5).

Subsequently, 16 sccm of Ar, 5.4 sccm of He, 0.3 sccm of $N_2$, 0.6 sccm of $B_2H_6$ are introduced to generate $H_2$, $N_2$, Ar plasmas for about one second. Here, a flow rate of $B_2H_6$ is set to about 10% of that of He. Accordingly, the surface of silicon nitride 4 containing an oxygen atom is etched by the $N_2$ and $H_2$ plasmas, and BN 6 is formed into a thickness of about 0.3 nm on silicon nitride 4 (step ST6).

The gate insulating film of the P-channel MOS transistor of FIG. 10 is completed by the above-described steps.

C. Effect

Effects by the semiconductor device and the manufacturing method according to the third embodiment will be described.

Figure 12:
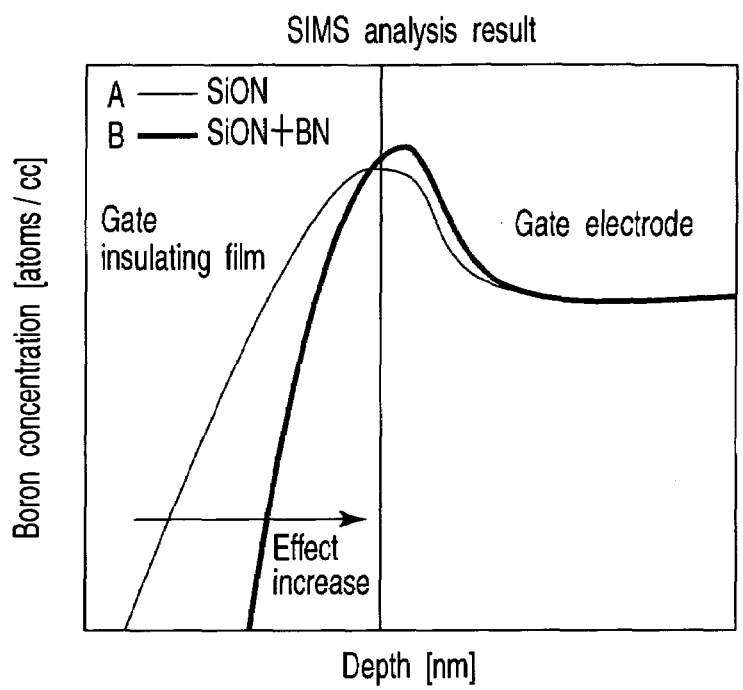
FIG. 12 is a characteristic diagram showing a penetrating/diffusing resistance of boron.

FIG. 12 shows degrees of penetration and diffusion of boron in a gate electrode by comparison in the structure of the gate insulating film.

Here, two types of gate insulating films are shown as examples, and it is assumed that either of them has a physical film thickness of 1.5 nm. First is a gate insulating film formed of silicon nitride (SiON) whose interface has been oxidized, and second is a gate insulating film comprising BN formed into a thickness of 0.3 nm on silicon nitride whose interface has been oxidized.

In the gate insulating film formed of silicon nitride whose interface has been oxidized, the penetration and diffusion of boron are suppressed to certain degrees, but this is not complete. On the other hand, in the gate insulating film comprising BN formed on silicon nitride whose interface has been oxidized, the penetration and diffusion of boron are substantially completely suppressed.

When the physical film thickness of the gate insulating film indicates a value of 2 nm or less in this manner, the diffusion preventive film (e.g., BN) containing the boron and nitrogen atoms is formed on the surface of the gate insulating film. This is very effective means for preventing the flat band shift by the penetration and diffusion of boron from the gate electrode into the gate insulating film.

Figure 13:
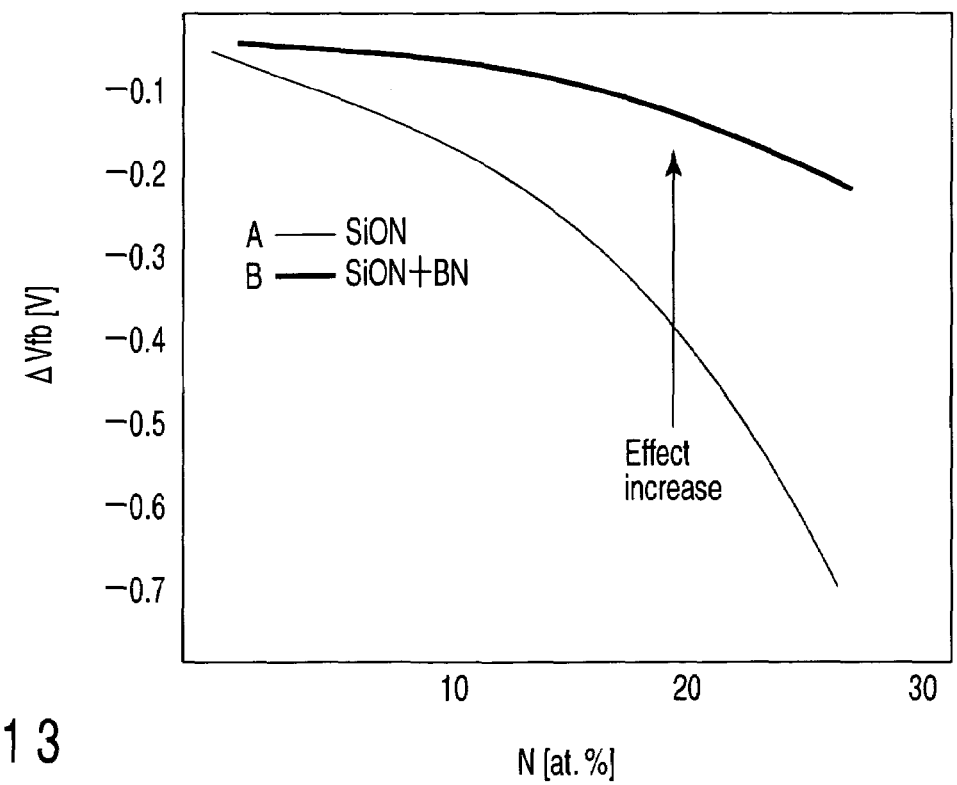
FIG. 13 is a characteristic diagram showing a relation between a nitrogen concentration in an insulating film and a flat band voltage of the MOS transistor.

FIG. 13 shows degrees of fluctuations of flat band voltage of a P-channel MOS transistor at a time when two types of gate insulating films compared in FIG. 12 are used. In this figure, we can consider that fluctuations of flat band voltage are a nearly equal to that of threshold voltage.

ΔVfb is a shift amount of the flat band voltage of the P-channel MOS transistor by the penetration and diffusion of boron, and corresponds to the fluctuation.

In the gate insulating film having the diffusion preventive film (e.g., BN) containing the boron and nitrogen atoms, it is seen that the shift amount ΔVfb of the flat band voltage is small as compared with a gate insulating film which does not have any diffusion preventive film.

Moreover, the abscissa indicates a nitrogen concentration N [at.%] in the gate insulating film. That is, the following is seen from the graph.

In the gate insulating film which does not have any diffusion preventive film (e.g., BN), when a nitrogen concentration increases in the gate insulating film, the shift amount ΔVfb of the flat band voltage excessively increases. However, in the gate insulating film having the diffusion preventive film, even when the nitrogen concentration increases in the gate insulating film, the shift amount ΔVfb of the flat band voltage does not excessively increase.

This is because, as described above, the diffusion preventive film inhibits penetration and diffusion of boron from the gate electrode into the gate insulating film.

Therefore, even in the third embodiment, when the physical film thickness of the gate insulating film of the P-channel MOS transistor indicates a value of 2 nm or less, controllability of flat band voltage Vfb and threshold voltage can be prevented from being deteriorated, and this can contribute to enhancement of performance of the LSI.

It is to be noted that when BN forming the diffusion preventive film contains metal nitride such as $Si_3N_4$ in a range of 0.05 to 0.15 wt %, characteristics such as peelability and moisture resistance are largely enhanced.

In the third embodiment, the diffusion preventive film containing the boron and nitrogen atoms is formed on silicon nitride whose interface has been oxidized, accordingly the penetration and diffusion of boron can be prevented, and further the gate insulating film can be strengthened.

(4) Fourth Embodiment

Next, a semiconductor device and a method of manufacturing the device will be described according to a fourth embodiment. The fourth embodiment is modification of the third embodiment. The fourth embodiment is different from the third embodiment in that the nitrogen concentration is raised in an oxidized portion (SiON) between silicon nitride and the diffusion preventive film.

A. Structure

FIG. 14 shows a structure of a P-channel MOS transistor according to a fourth embodiment.

P-type diffusion layers 12A, 12B are formed in a surface region of an N-type silicon substrate (may be a well) 11. A gate electrode 14 is formed on a channel region between the P-type diffusion layers 12A, 12B via a gate insulating film 13. The gate electrode 14 comprises a polysilicon containing P-type impurities (e.g., boron).

Here, the gate insulating film 13 comprises: silicon nitride (SiN) whose interface has been oxidized; and a diffusion preventive film formed on silicon nitride and containing boron and nitrogen atoms.

Moreover, the nitrogen concentration is increased in an oxidized portion between silicon nitride and the diffusion preventive film. That is, the nitrogen concentration of the portion is higher than that of another portion.

It is to be noted that the gate insulating film 13 which is constituted of silicon nitride may be a nitrogen-containing insulating film, and it may contain, for example, an atom (excluding the boron atom) such as the oxygen atom other than nitrogen and silicon atoms.

Moreover, the diffusion preventive film comprises, for example, BN.

Since the diffusion preventive film has a function of simultaneously preventing both penetration and diffusion of boron in the gate electrode 14, a flat band shift in the P-channel MOS transistor can be effectively prevented even if the gate insulating film becomes thin.

B. Manufacturing Method

Figure 15:
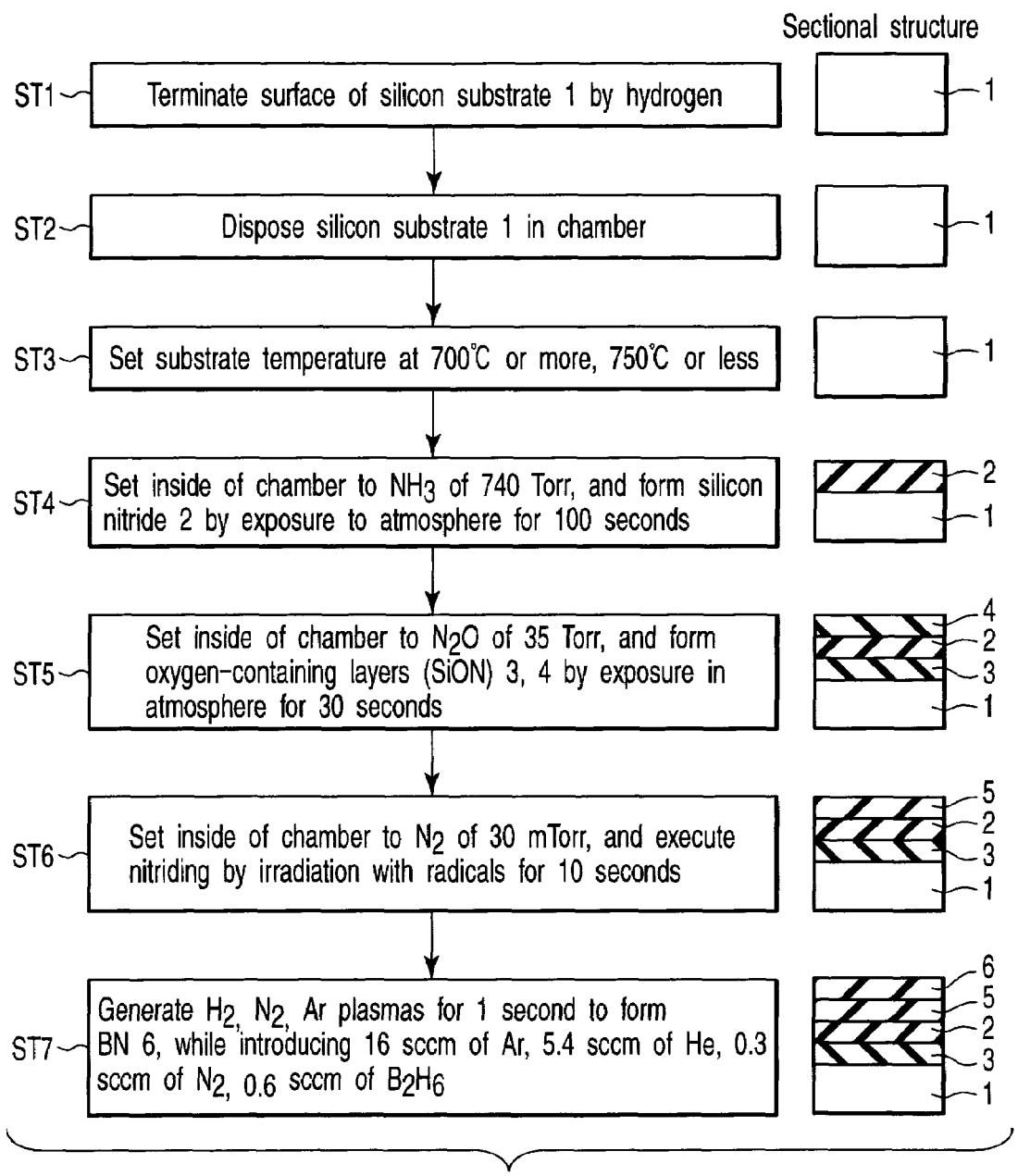
FIG. 15 is a diagram showing a method of manufacturing a gate insulating film of the MOS transistor of FIG. 14.

Next, a method of manufacturing a gate insulating film in the MOS transistor of FIG. 14 will be described with reference to FIG. 15.

First, a silicon substrate 1 is treated with dilute HF, and the surface of the silicon substrate 1 is terminated by hydrogen (step ST1). Thereafter, the silicon substrate 1 is introduced into a chamber (step ST2). Subsequently, an atmosphere in the chamber is set to, for example, $NH_3$ of 740 Torr, a heater is controlled to thereby set temperature of the surface of the silicon substrate 1 at 700° C. or more, 750° C. or less (e.g., 700° C.), and this state is maintained for about 100 seconds. As a result, silicon nitride (SiN) 2 is formed on the silicon substrate 1 (steps ST3 and ST4).

Next, the chamber is filled with, for example, $N_2O$ of 35 Torr, and a heater is controlled to thereby set temperature of the surface of the silicon substrate 1 at 800° C. or more, 1000° C. or less (e.g., 800° C.) and this state is maintained for about 30 seconds. As a result, silicon nitrides (e.g., SiON) 3, 4 containing the oxygen atom are formed on an interface of silicon nitride 2, that is, between the silicon substrate 1 and silicon nitride 2, and on the upper surface of silicon nitride 2 (step ST5).

Subsequently, the chamber is filled with, for example, $N_2$ of 30 mTorr, and irradiated with plasmas (radicals) for about 10 seconds. As a result, the nitrogen atom is introduced into silicon nitride 4 containing the oxygen atom, and silicon nitride 4 containing the oxygen atom constitutes an oxynitride layer 5 (step ST6)

Subsequently, 16 sccm of Ar, 5.4 sccm of He, 0.3 sccm of $N_2$, 0.6 sccm of $B_2H_6$ are introduced to generate $H_2$, $N_2$, Ar plasmas for about one second. Here, a flow rate of $B_2H_6$ is set to about 10% of that of He. Accordingly, the surface of the oxynitride layer 5 containing highly concentrated nitrogen is etched by the $N_2$ and $H_2$ plasmas, and BN 6 is formed into a thickness of about 0.3 nm on the oxynitride layer 5 (step ST7).

The gate insulating film of the P-channel MOS transistor of FIG. 14 is completed by the above-described steps.

C. Effect

Effects by the semiconductor device and the manufacturing method according to the fourth embodiment will be described.

Figure 16:
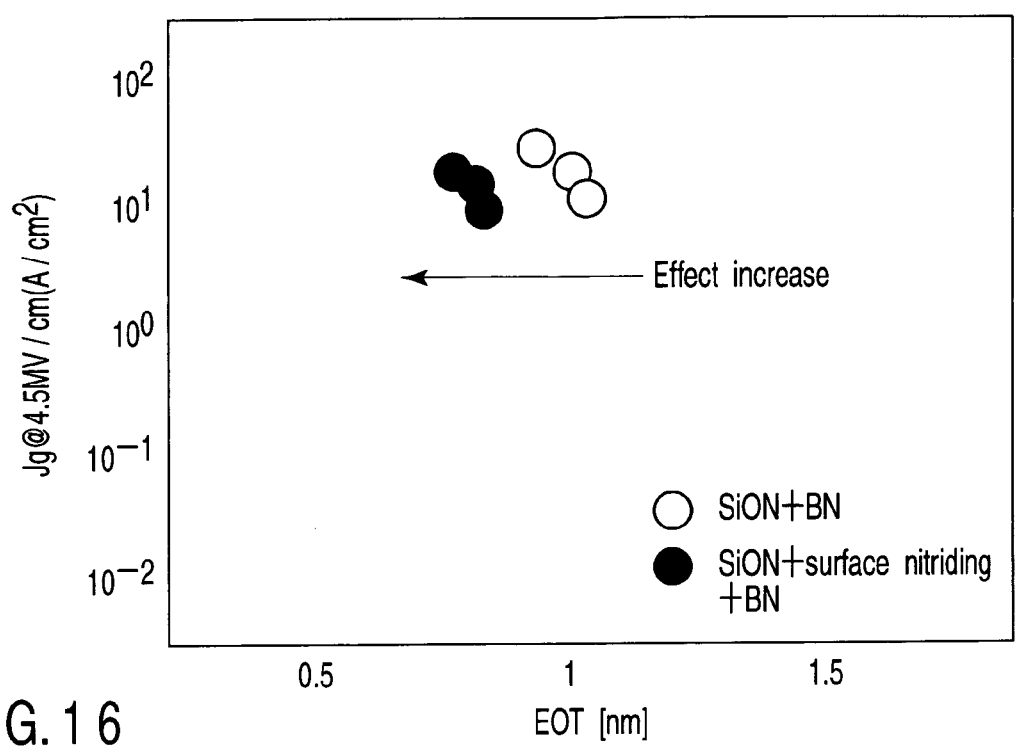
FIG. 16 is a characteristic diagram showing an EOT-Jg characteristic of the insulating film according to an example of the present invention.

FIG. 16 shows EOT-Jg relations in a case where nitriding (referred to as surface nitriding) is performed as shown in the step ST6 of the manufacturing method and in a case where the nitriding is not performed.

Here, EOT stands for equipment oxide thickness, and Jg denotes an index indicating a degree of gate leak. When a value of Jg decreases, the gate leak decreases, and satisfactory characteristics are obtained.

The characteristics are shown by white circles with respect to the gate insulating film comprising a BN film directly disposed on an SiON film and having a physical film thickness of 1.5 nm. The characteristics are shown by black circles with respect to the gate insulating film comprising the BN film disposed on SiON after nitriding the surface of the SiON film and having a physical film thickness of 1.5 nm.

It is seen from the figure that the EOT-Jg relation is improved, when the surface nitriding is performed, as compared with the case where the nitriding is not performed. That is, when gate leak is kept at a certain constant value, for example, $10^2$ [A/cm$^2$], the EOT indicates a small value in the case where the surface nitriding is performed, as compared with the case where the nitriding is not performed.

This is supposedly because $SiO_2$ formed on the surface of the SiON film is nitrided by plasma nitriding, accordingly oxygen and nitrogen are substituted, and permittivity of the gate insulating film is enhanced.

Figure 17:
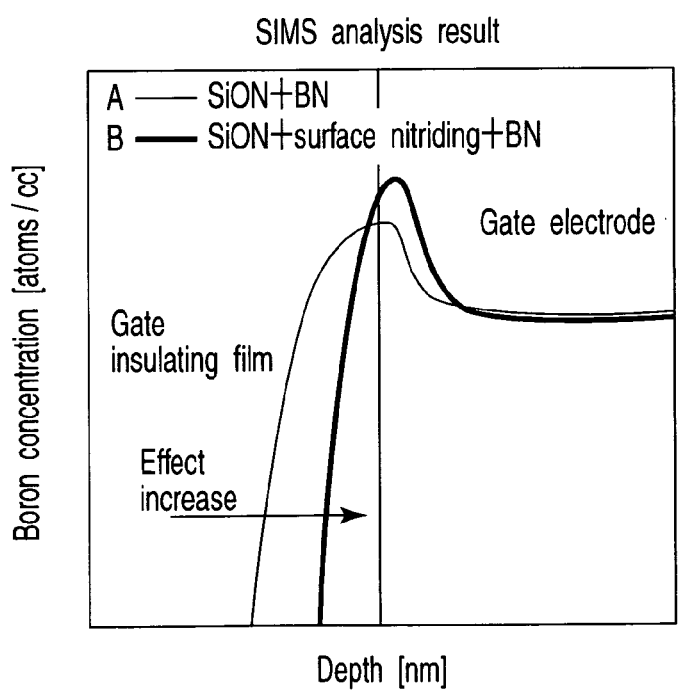
FIG. 17 is a characteristic diagram showing a penetrating/diffusing resistance of boron.

FIG. 17 shows a degree of penetration and diffusion of boron in the gate electrode by comparison in the structure of the gate insulating film.

Here, two types of gate insulating films are shown as examples, and it is assumed that either of them has a physical film thickness of 1.5 nm. First is a gate insulating film formed of silicon nitride (SiON) whose interface has been oxidized and a diffusion preventive film (BN), and second is a gate insulating film comprising silicon nitride whose interface subjected to surface nitriding has been oxidized and the diffusion preventive film.

In the gate insulating film which is not subjected to the surface nitriding, the penetration and diffusion of boron are suppressed to certain degrees, but this is not complete. On the other hand, in the gate insulating film subjected to the surface nitriding, the penetration and diffusion of boron are substantially completely suppressed.

When the physical film thickness of the gate insulating film indicates a value of 2 nm or less in this manner, the diffusion preventive film (e.g., BN) containing the boron and nitrogen atoms is formed on the surface of the gate insulating film, and further the surface nitriding is performed. This is very effective means for preventing the flat band shift by the penetration and diffusion of boron from the gate electrode into the gate insulating film.

Figure 18:
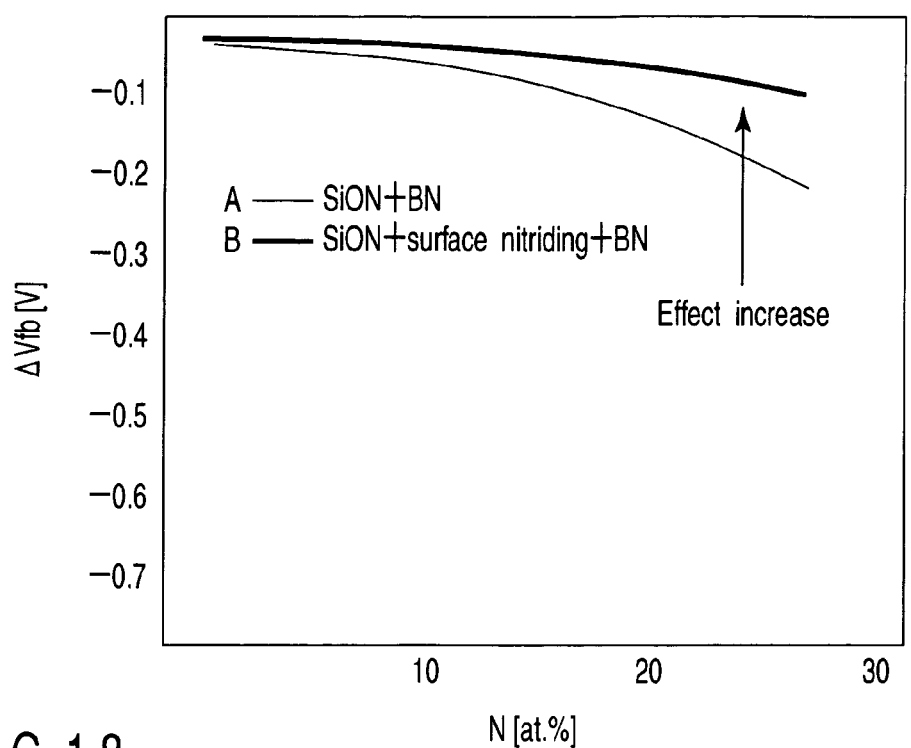
FIG. 18 is a characteristic diagram showing a relation between a nitrogen concentration in an insulating film and a flat band voltage of the MOS transistor.

FIG. 18 shows degrees of fluctuations of flat band voltage of a P-channel MOS transistor at a time when two types of gate insulating films compared in FIG. 17 are used. In this figure, we can consider that fluctuations of flat band voltage are nearly equal to that of threshold voltage.

ΔVfb is a shift amount of the flat band voltage of the P-channel MOS transistor by the penetration and diffusion of boron, and corresponds to the fluctuation.

In the gate insulating film having the diffusion preventive film (e.g., BN) containing the boron and nitrogen atoms, as shown in FIG. 13, the shift amount ΔVfb of the flat band voltage is small as compared with a gate insulating film which does not have any diffusion preventive film.

Moreover, when the surface of the SiON film is nitrided, the shift amount ΔVfb of the flat band voltage can further be reduced as compared with the case where the surface nitriding is not performed.

Here, the abscissa indicates a nitrogen concentration N [at.%] in the gate insulating film. That is, when the surface nitriding is performed, the shift amount ΔVfb can be maintained at a small value even with the increase of the nitrogen concentration in the gate insulating film.

This is because combination of the surface nitriding with the diffusion preventive film inhibits the penetration and diffusion of boron from the gate electrode into the gate insulating film.

Therefore, even in the fourth embodiment, when the physical film thickness of the gate insulating film of the P-channel MOS transistor indicates a value of 2 nm or less, controllability of threshold voltage Vth and flat band voltage can be prevented from being deteriorated, and this can contribute to enhancement of performance of the LSI.

Figure 19:
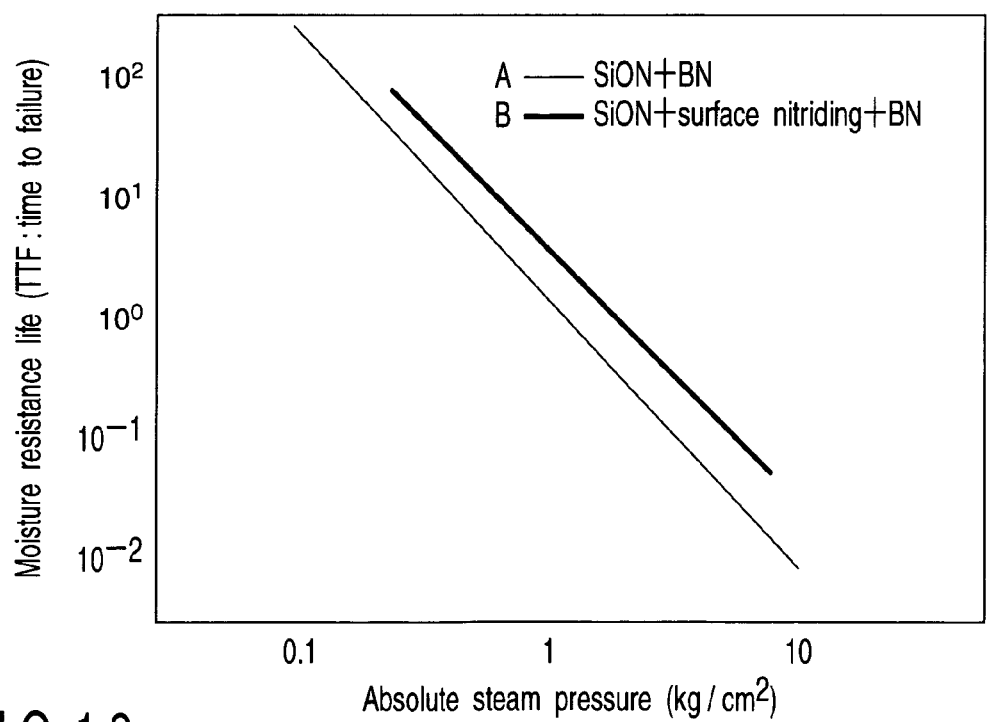
FIG. 19 is a characteristic diagram showing a moisture resistance of the insulating film according to an example of the present invention.

FIG. 19 is a graph showing changes of moisture resistances of the gate insulating films in a case where (third embodiment) the diffusion preventive film is formed on the SiON film and a case where (fourth embodiment) the diffusion preventive film is formed on the SiON film subjected to the surface nitriding.

It is seen from the figure that the gate insulating film subjected to the surface nitriding is superior in moisture resistance to the gate insulating film which is not subjected to the surface nitriding.

This is because by the nitriding of the surface of the SiON film to increase the nitrogen concentration, a part of silicon nitride in the gate insulating film changes to metal nitride, a bonded state between silicon nitride and the diffusion preventive film is stabilized, and the gate insulating film becomes inactive.

It is to be noted that when BN forming the diffusion preventive film contains metal nitride such as $Si_3N_4$ in a range of 0.05 to 0.15 wt %, characteristics such as peelability and moisture resistance are largely enhanced.

In the fourth embodiment, by combination of the surface-nitrided SiON film and the diffusion preventive film containing the boron and nitrogen atoms, the penetration and diffusion of boron can be effectively prevented, and further the gate insulating film can be strengthened.

3. Others

In the above-described first to fourth embodiments, an atomic density of a diffusion preventive film containing at least boron and nitrogen atoms is higher than that of an oxide film or a nitride film. The diffusion preventive film preferably contains $1 \times 10^{18}$ cm$^{-3}$ or more of the boron atom.

Moreover, to sufficiently fulfill a function of the diffusion preventive film, a surface density of the boron atom may be set to be higher than that of the nitrogen atom in the diffusion preventive film.

The diffusion preventive film is formed by generation of plasmas in an atmosphere constituted of a gas containing the nitrogen atom and a gas containing the boron atom. For example, the gas containing the nitrogen atom contains any of $NH_3$, $N_2O$, N, and $N_2$.

When the example of the present invention is applied to a gate insulating film of a P-channel MOS transistor, a gate electrode is formed of a polysilicon containing the boron atom.

Here, the diffusion preventive film may be formed using, for example, the polysilicon containing the boron atom. That is, after forming the polysilicon containing the boron atom, the polysilicon is exposed to the gas containing the nitrogen atom, and accordingly the diffusion preventive film can be easily formed containing the boron and nitrogen atoms.

According to the example of the present invention, there can be provided an insulating film having a high nitrogen concentration, high permittivity (high-K), small EOT, superior moisture resistance, and small shift amount of threshold voltage. As described above, this technique can contribute to realization of a high-performance MOS transistor in which gate leak, flat band shift and the like are suppressed, for example, when applied to the gate insulating film of the P-channel MOS transistor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
a semiconductor substrate; and
an insulating film formed on the semiconductor substrate, wherein the insulating film has a first region comprising $SiO_2$, a second region comprising SiN which is provided on the first region, and a third region containing nitrogen atoms and $1\times10^{18}$ $cm^{-3}$ or more boron atoms which is provided on the second region.

2. The semiconductor device according to claim 1, wherein the insulating film is used as a gate insulating film of a P-channel MOS transistor.

3. The semiconductor device according to claim 2, wherein a gate electrode of the P-channel MOS transistor is formed of a polysilicon containing boron atoms.

4. The semiconductor device according to claim 3, wherein the third region is adjacent to the gate electrode.

5. The semiconductor device according to claim 1, wherein a surface density of boron atoms is higher than that of nitrogen atoms in the third region.

6. A semiconductor device comprising:
a semiconductor substrate; and
an insulating film formed on the semiconductor substrate, wherein the insulating film has a first region comprising SiON, a second region comprising SiN which is provided on the first region, a third region comprising SiON which is provided on the second region, and a fourth region containing nitrogen atoms and $1\times10^{18}$ $cm^{-3}$ or more boron atoms which is provided on the third region.

7. The semiconductor device according to claim 6, wherein a nitrogen concentration of the third region is higher than that of the first region.

8. The semiconductor device according to claim 6, wherein the insulating film is used as a gate insulating film of a P-channel MOS transistor.

9. The semiconductor device according to claim 8, wherein a gate electrode of the P-channel MOS transistor is formed of a polysilicon containing boron atoms.

10. The semiconductor device according to claim 9, wherein the fourth region is adjacent to the gate electrode.

11. The semiconductor device according to claim 6, wherein an atomic density of the fourth region is higher than that of the second region.

12. The semiconductor device according to claim 6, wherein a surface density of boron atoms is higher than that of nitrogen atoms in the fourth region.

13. A manufacturing method of a semiconductor device, comprising:
forming a first region comprising $SiO_2$ on a semiconductor substrate;
forming a second region comprising SiN on the first region; and forming a third region containing nitrogen atoms and $1\times10^{18}$ $cm^{-3}$ or more boron atoms on the second region.

14. The manufacturing method according to claim 13, wherein the third region is formed by generation of plasmas in an atmosphere formed of a gas containing nitrogen atoms and a gas containing boron atoms.

15. The manufacturing method according to claim 14, wherein the gas containing nitrogen atoms contains any of $NH_3$, $N_2O$, N, and $N_2$.

16. The manufacturing method according to claim 13, wherein the polysilicon containing boron atoms constituting a gate electrode of a P-channel MOS transistor is formed on the third region.

17. The manufacturing method according to claim 13, wherein the third region is formed by exposure of the polysilicon containing boron atoms to a gas containing nitrogen atoms.

18. A manufacturing method of a semiconductor device, comprising:
forming a first region comprising SiON on a semiconductor substrate;
forming a second region comprising SiN on the first region;
forming a third region comprising SiON on the second region; and
forming a fourth region containing nitrogen atoms and $1\times10^{18}$ $cm^{-3}$ or more boron atoms on the third region.

19. The manufacturing method according to claim 18, wherein the first and third regions are formed by an oxidation of the second region.

20. The manufacturing method according to claim 19, further comprising:
injecting nitrogen atoms into the third region, and setting a nitrogen concentration of the third region to be higher than that of the first region.

21. The manufacturing method according to claim 19, wherein the second region is formed at 700° C. or more and 750° C. or less.

22. The manufacturing method according to claim 21, wherein the first and third regions are formed at 800° C. or more and 1000° C. or less.

23. The manufacturing method according to claim 18, wherein the fourth region is formed by generation of plasmas in an atmosphere formed of a gas containing nitrogen atoms and a gas containing boron atoms.

24. The manufacturing method according to claim 23, wherein the gas containing nitrogen atoms contains any of $NH_3$, $N_2O$, N, and $N_2$.

25. The manufacturing method according to claim 18, wherein the polysilicon containing boron atoms constituting a gate electrode of a P-channel MOS transistor is formed on the fourth region.

26. The manufacturing method according to claim 18, wherein the fourth region is formed by exposure of the polysilicon containing boron atoms to a gas containing nitrogen atoms.

* * * * *